United States Patent
Raynal et al.

(10) Patent No.: US 11,380,543 B2
(45) Date of Patent: Jul. 5, 2022

(54) METHOD FOR FABRICATING A MONOCRYSTALLINE STRUCTURE

(71) Applicants: COMMISSARIAT À L'ÉNERGIE ATOMIQUE ET AUX ENERGIES ALTERNATIVES, Paris (FR); UNIVERSITÉ GRENOBLE ALPES, Saint Martin D'Heres (FR); CENTRE NATIONAL DE LA RECHERCHE SCIENTIFIQUE, Paris (FR)

(72) Inventors: Pierre-Edouard Raynal, Grenoble (FR); Pascal Besson, Notre-Dame-de-Mésage (FR); Jean-Michel Hartmann, Montbonnot-Saint-Martin (FR); Virginie Loup, Saint-Egrève (FR); Laurent Vallier, Montbonnot-Saint-Martin (FR)

(73) Assignees: COMMISSARIAT À L'ÉNERGIE ATOMIQUE ET AUX ENERGIES ALTERNATIVES, Paris (FR); UNIVERSITÉ GRENOBLE ALPES, Saint Martin D'Heres (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 3 days.

(21) Appl. No.: 16/717,587

(22) Filed: Dec. 17, 2019

(65) Prior Publication Data
US 2020/0194259 A1    Jun. 18, 2020

(30) Foreign Application Priority Data
Dec. 17, 2018 (FR) ...................... 1873118

(51) Int. Cl.
*C30B 29/08* (2006.01)
*H01L 21/02* (2006.01)
(Continued)

(52) U.S. Cl.
CPC ...... *H01L 21/02598* (2013.01); *C30B 25/183* (2013.01); *C30B 25/186* (2013.01);
(Continued)

(58) Field of Classification Search
CPC ....... C30B 29/40; C30B 29/08; C30B 25/183; C30B 25/186
See application file for complete search history.

(56) References Cited

U.S. PATENT DOCUMENTS 7,462,239 B2   12/2008   Brabant et al.
8,501,629 B2   8/2013   Tang et al.
(Continued)

OTHER PUBLICATIONS

Raynal et al.; Wet and Siconi® cleaning sequences for SiGe p-type metal oxide semiconductor channels; Microelectronic Engineering; 2018; pp. 84-89; vol. 187-188.
(Continued)

*Primary Examiner* — Robert M Kunemund
(74) *Attorney, Agent, or Firm* — Oliff PLC

(57) ABSTRACT

A substrate is provided with a monocrystalline silicon-germanium layer with a first surface covered by a protective oxide obtained by wet process and having a degradation temperature. The protective oxide is transformed into fluorinated salt which is then eliminated. The substrate is placed in a processing chamber at a lower temperature than the degradation temperature and is subjected to a temperature ramp up to a higher temperature than the degradation temperature. The first surface is annealed in a hydrogen atmosphere devoid of silicon, germanium and precursors of the materials forming the target layer. When the temperature
(Continued)

ramp is applied, a silicon precursor is inserted in the processing chamber between a loading temperature and the degradation temperature to deposit a monocrystalline buffer layer. A mono-crystalline target layer is deposited by chemical vapour deposition.

13 Claims, 3 Drawing Sheets

(51) Int. Cl.
 *C30B 25/18* (2006.01)
 *C30B 29/40* (2006.01)
 *C30B 29/52* (2006.01)
(52) U.S. Cl.
 CPC .............. *C30B 29/08* (2013.01); *C30B 29/40* (2013.01); *C30B 29/52* (2013.01); *H01L 21/0245* (2013.01); *H01L 21/02054* (2013.01); *H01L 21/0262* (2013.01); *H01L 21/02502* (2013.01); *H01L 21/02532* (2013.01); *H01L 21/02538* (2013.01); *H01L 21/02634* (2013.01)

(56) References Cited

U.S. PATENT DOCUMENTS

| | | | |
|---|---|---|---|
| 2008/0032906 A1* | 2/2008 | Verhaverbeke | C11D 11/007 510/175 |
| 2009/0029529 A1 | 1/2009 | Shin | |
| 2016/0192502 A1 | 6/2016 | Tolle et al. | |

OTHER PUBLICATIONS

Yang et al.; Advanced in situ pre-Ni silicide (Siconi) cleaning at 65 nm to resolve defects in NiSix modules; Journal of Vacuum Science & Technology B; 2010; pp. 56-61; vol. 28.

* cited by examiner

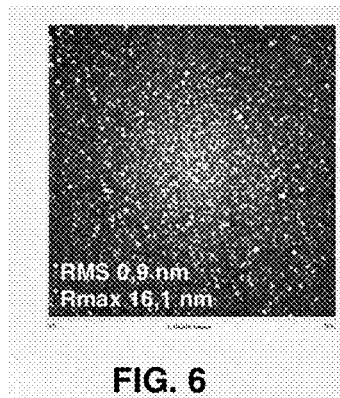
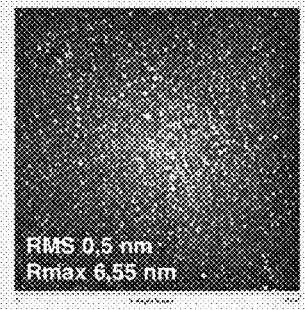
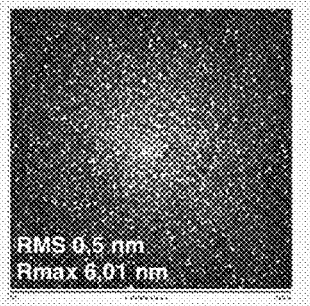
FIG. 6  FIG. 7  FIG. 8
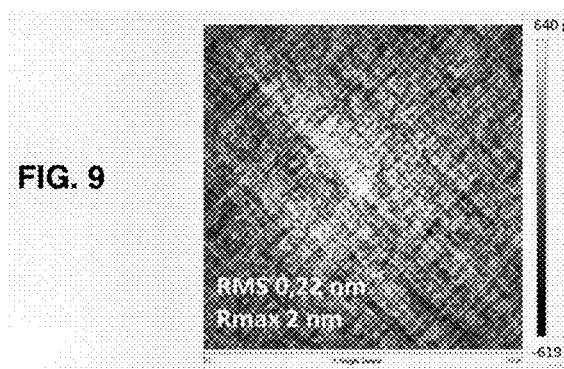
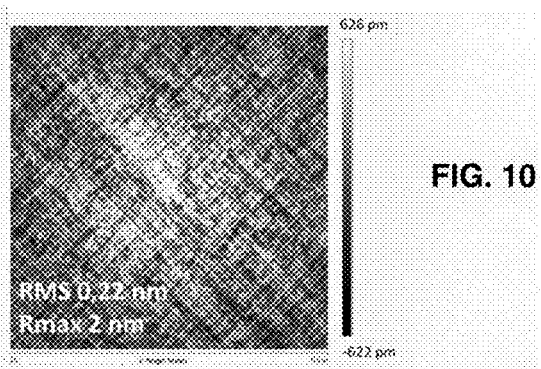
FIG. 9  FIG. 10
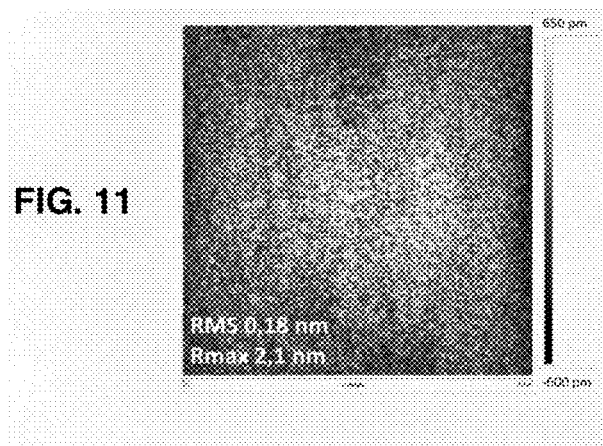
FIG. 11

Germanium

Silicon

Oxygen

METHOD FOR FABRICATING A MONOCRYSTALLINE STRUCTURE

BACKGROUND OF THE INVENTION

The invention relates to a method for fabricating a monocrystalline structure comprising an epitaxy step starting from a silicon-germanium alloy layer.

PRIOR ART

It is known to fabricate semiconductor devices using one or more silicon layers that are functionalised for example to form a conduction channel of a field effect transistor. However, the performances of silicon do not always enable the expected electrical and/or mechanical requirements to be achieved so that as a result new materials, in particular germanium, are now being used to replace silicon. This results in germanium occupying an increasingly large place in the fabrication of modern microelectronic devices.

An increasing interest exists in particular in the use of silicon-germanium alloy films instead of silicon films to improve the electrical performances of devices such as field effect transistors which will be able to use these alloys as conduction channels.

Unfortunately silicon-germanium alloy films are more difficult to use than silicon films which makes fabrication methods more complicated to perform. Silicon-germanium alloy films are very often strained, in particular compressively strained, which means that application of a high thermal budget may result in deformation of the film. This deformation can result in undulation of the film or relaxation of the latter. In the same way as for silicon films, silicon-germanium films deposited on a dielectric material layer tend to dewet when the thermal budget is too high thereby making deposition of a quality monocrystalline film impossible.

Solutions are being sought for to make it easier to work with silicon-germanium alloy films. In a large number of microelectronic device fabrication methods, it becomes necessary to thicken the silicon-germanium alloy film in places or in more general manner to perform a resumption of epitaxy from the free surface of the alloy layer.

As the thermal budget accepted by the silicon-germanium alloy is limited, this imposes a large technological constraint when it is desired to deposit a mono-crystalline target layer of any material lattice matched with the monocrystalline layer of silicon-germanium alloy. The operating conditions have to be chosen so as not to degrade the alloy layer while at the same time depositing a quality target layer.

It is conventional to subject the alloy layer to a hydrofluoric acid bath in order to remove the oxide present on its surface. The surface of the alloy layer that has been deoxidised is then rapidly inserted in a processing chamber of an epitaxy apparatus to undergo a hydrogen anneal, typically at 650° C. for a few minutes to complete the surface preparation. After the hydrogen anneal, a monocrystalline layer is deposited on the silicon-germanium alloy. The result is generally unsatisfactory.

It is known from the document U.S. Pat. No. 7,462,239 to deposit a monocrystalline film on a monocrystalline silicon-germanium alloy layer. The silicon-germanium alloy layer is subjected to a deoxidising step by means ofmmp a hydrofluoric acid bath. After deoxidation of the surface, the substrate containing the alloy layer is placed in a processing chamber at a temperature of less than 500° C. before a rapid temperature ramp is applied in a hydrogen atmosphere up to about 700° C. in order to perform epitaxial deposition in the 450° C.-950° C. range.

It has further been shown that silicon-germanium alloy surfaces are very reactive to air and oxidise quickly. This fast oxidisation of silicon-germanium alloys means that the technologist has to limit as far as possible the time during which the surfaces of the silicon-germanium alloys are uncovered. This issue is particularly important when it is envisaged to clean the substrate surface before performing thickening of at least a part of the substrate by epitaxy to deposit a mono-crystalline material lattice matched with the underlying monocrystalline layer of silicon-germanium alloy.

In an industrial approach, it is not always easy to limit the sequencing of two consecutive technological steps with very short durations of about a few minutes. Means enabling deposition of a quality monocrystalline target layer to be performed under more varied operating conditions are therefore sought for.

It is also apparent that even by limiting the time between treatment by hydrofluoric acid and deposition by epitaxy, the quality of the deposited layers is not always satisfactory. Studies have shown that the use of a hydrofluoric acid bath quickly followed or not by the hydrogen anneal step results in the presence of extensive oxygen, carbon and fluorine pollution at the interface between the silicon-germanium alloy and the deposited target layer.

This pollution can have a very negative effect on the quality of the deposited layer and can also have an impact on the subsequent technological steps and/or on the performances of the final device. A general problem exists concerning integration of epitaxy resumption on silicon-germanium alloy films.

OBJECT OF THE INVENTION

The object of the invention is to provide a method for depositing a monocrystalline film lattice matched with a first silicon-germanium alloy layer of a substrate, the method being easy to perform and enabling a silicon-germanium alloy film with a lower surface roughness to be formed.

This object tends to be achieved by means of a crystal growth method by epitaxy of a monocrystalline target layer successively comprising:
  providing a substrate comprising a first monocrystalline layer of silicon-germanium alloy with a first surface covered by a protective oxide obtained by wet process oxidation of the first surface, the first surface having a degradation temperature at which the first surface forms dots,
  subjecting the protective oxide to plasma treatment to form a fluorinated salt and then eliminating the fluorinated salt by means of an anneal,
  inserting the substrate in a processing chamber at a loading temperature lower than the degradation temperature,
  subjecting the substrate to a temperature ramp from the loading temperature to an annealing temperature higher than the degradation temperature, and formation of a buffer layer during these steps by adding a precursor in the processing chamber,
  annealing the first surface at a temperature higher than or equal to the annealing temperature in a hydrogen or nitrogen atmosphere, the processing chamber being devoid of any precursor of the materials forming the target layer, of silicon and of germanium during the anneal, depositing the monocrystalline target layer lattice matched with the first monocrystalline layer by chemical vapor deposition.

In one development, the thickness of the buffer layer is less than or equal to 2 nm.

In a particular embodiment, during the temperature ramp, the atmosphere in the processing chamber is devoid of any germanium precursor.

In advantageous manner, the maximum growth rate of the buffer layer is less than 2 nm/min.

Preferentially, the loading temperature is lower than 500° C.

It is advantageous to provide for the buffer layer to have a continually decreasing germanium content from the interface with the first monocrystalline layer to the target layer.

In an advantageous embodiment, the target layer is chosen from a silicon-germanium alloy, a pure germanium film, or a material of III-V type.

In another development, the first surface has a germanium content comprised between 20% and 95% atomic.

Advantageously, the buffer layer is made from silicon-germanium alloy having a germanium content of less than 15% atomic and is less than the germanium content of the first surface by at least 5% atomic or the buffer layer is made from pure germanium.

Preferentially, the degradation temperature being higher than or equal to 550° C.,
the silicon precursor contains dichlorosilane, or
the degradation temperature being comprised between 500° C. and 600° C., the silicon precursor contains silane, or
the degradation temperature being comprised between 450° C. and 550° C., the silicon precursor contains disilane, or
the degradation temperature being lower than 500° C., the silicon precursor contains trisilane and/or tetrasilane.

BRIEF DESCRIPTION OF THE DRAWINGS

Other advantages and features will become more clearly apparent from the following description of particular embodiments and implementation modes of the invention given for non-restrictive example purposes only and represented in the appended drawings, in which:

FIG. 6 represents a measurement by atomic force microscopy of a silicon-germanium layer deposited on a silicon-germanium layer with a cleaning and/or preparation method according to the prior art;

FIG. 7 represents a measurement by atomic force microscopy of a silicon-germanium layer deposited on a silicon-germanium layer with another cleaning and/or preparation method according to the prior art;

FIG. 8 represents a measurement by atomic force microscopy of a silicon-germanium layer deposited on a silicon-germanium layer with another cleaning and/or preparation method according to the prior art;

FIG. 9 represents a measurement by atomic force microscopy of a silicon-germanium layer deposited on a silicon-germanium layer with another cleaning and/or preparation method according to the prior art;

FIG. 10 represents a measurement by atomic force microscopy of a silicon-germanium layer deposited on a silicon-germanium layer with another cleaning and/or preparation method according to the prior art;

FIG. 11 represents a measurement by atomic force microscopy of a silicon-germanium layer deposited on a silicon-germanium layer with another cleaning and preparation method according to the invention.

DESCRIPTION OF THE EMBODIMENTS

Figure 1:
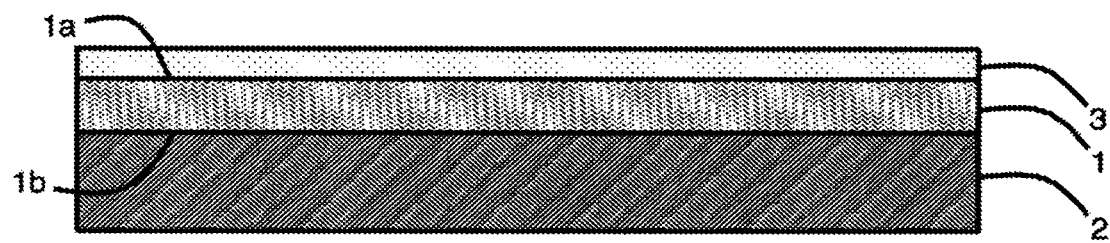
FIG. 1 represents a first step of a method for fabricating a monocrystalline structure, in schematic manner, in cross-section.

As illustrated in FIG. 1, a substrate is provided comprising a first monocrystalline layer 1 made from silicon-germanium alloy. First monocrystalline layer 1 is formed on a support 2 that is advantageously monocrystalline, for example a substrate made from monocrystalline silicon. First layer 1 can be strained, partially relaxed or totally relaxed so that the lattice parameter can be matching or mismatching the lattice parameter of support 2. The support can also be a substrate of SOI (Semiconductor On Insulator) type.

First layer 1 advantageously comprises a germanium content comprised between 5% and 95% atomic and even more advantageously between 10% and 90% atomic in order to diverge from the behaviour of a pure silicon or pure germanium film. First layer 1 of silicon-germanium alloy can have a constant germanium content over its whole thickness or it can have a variable content.

First monocrystalline layer 1 can cover a whole surface of the substrate or only a part of the surface of the substrate. It is possible for the surface of the substrate to be defined by first monocrystalline layer 1 and by one or more other material for example electrically insulating materials such as for example a silicon oxide or a silicon nitride. The surface of the substrate comprising first layer 1 can be a heterogeneous surface and contain at least two different materials at the surface of first layer 1.

First layer 1 presents two opposite surfaces with a first surface 1a that is opposite the surface 1b in contact with support 2. First layer 1 is covered by a protective layer 3 that is an oxide layer obtained by wet process, i.e. by wet process oxidation of the first surface of the alloy.

The method enables deposition of a monocrystalline target layer 4 lattice matched with first monocrystalline layer 1 made of silicon-germanium alloy. Target layer 4 is of better quality than with the methods of the prior art and the interface contamination on first surface 1a is also very greatly reduced.

Monocrystalline target layer 4 can be made from a material of IV type such as silicon, silicon-germanium alloy, pure germanium or from a material of III-V type. The materials of III-V type are those whose deposition conditions are compatible with the thermal budget acceptable by first monocrystalline layer 1 of silicon-germanium alloy.

For example purposes, a GaAs layer can be deposited at about 580° C. which makes it compatible with a first layer 1 made from silicon-germanium alloy with a germanium content substantially equal to 30% or 40% atomic and that can withstand a hydrogen anneal at least up to 650° C. On the other hand, a GaN layer is deposited well over 650° C. and is not compatible with first layer 1. The III-V materials envisaged are chosen for example from GaAs, InP, InSb, AlAs and mixtures thereof.

Target layer 4 can be non-intentionally doped, doped with boron, doped with arsenic or with phosphorus or other electrical dopant materials. It is also conceivable to add carbon in substitutional or interstitial position in the crystal lattice.

To improve the quality of first surface 1*a* and in particular to reduce the contamination of first surface 1*a*, it is proposed to apply a cleaning step on first monocrystalline silicon-germanium alloy layer 1 prior to epitaxy of target layer 4.

In a particular embodiment, protective layer 3 made of oxide obtained by chemical process is formed in the following manner.

First monocrystalline layer 1 undergoes a cleaning step comprising application of a hydrofluoric acid solution, preferentially hydrofluoric acid diluted in deionised water to remove a possible oxide layer present on the surface or contaminants of oxide type present on surface 1*a* of first layer 1. The oxide layer to be removed can be a native oxide, a thermal oxide or a deposited oxide.

Once first surface 1*a* of first layer 1 has been deoxidised, the latter is subjected to an oxidation step of first surface 1*a* by chemical process, preferably by wet process, in order to form protective oxide 3. As protective oxide 3 is formed by chemical process, it has a different composition from a native or thermal oxide obtained from the same material. Protective oxide 3 formed by chemical process has a chemical composition different from an oxide formed by dry process such as a native oxide and will subsequently react differently.

Protective oxide 3 obtained by chemical process has a behaviour that is closer to a silicon oxide than to a silicon and germanium oxide obtained by native or thermal oxidation of the alloy.

Oxidation by wet process is advantageously achieved by means of an oxidising bath.

The oxidising bath contains for example a solution of nitric acid $NH_4OH$, oxygenated water $H_2O_2$ and deionised water $HO_2$. Protective oxide layer 3 can be obtained by means of a solution commonly referred to as SC1 standing for Standard Cleaning 1. As an alternative, protective layer 3 made of oxide can be formed by a solution containing deionised water and ozone $O_3$, for example with an ozone content comprised between 5 ppm and 20 ppm. A detailed description of the structural properties of such oxides can be found in the publication "Wet and Siconi Cleaning sequences for SiGe p-type metal oxide semiconductor channels" by P. E. Raynal et al. Microelectron. Eng., vol. 187-188, p. 84-89, February 2018, for 40% SiGe surfaces. The thicknesses of these chemical oxides are then typically in the 1.4 nm-1.9 nm range and the latter are, according to X-ray photoelectron spectroscopic XPS, almost or totally exempt from any traces of $GeO_2$ and carbon. The thickness of the protective oxides is advantageously more than 1 nm. Preferentially, the thickness of the protective oxides is less than 5 nm, even more preferentially less than 3 nm. It is advantageous to provide for protective oxide 3 to contain a majority of the volume of the SiO2.

The use of a protective layer 3 obtained by means of a controlled process makes it possible to master contamination at first surface 1*a* of the substrate during the period that follows the formation of protective layer 3 and that precedes the epitaxy step. The results are more repeatable. The presence of the chemical oxide enables first surface 1*a* to be protected against external contaminants.

Formation of protective layer 3 is advantageously performed a few tens of seconds after application of the hydrofluoric acid bath, preferably less than 15 minutes after. In an alternative embodiment, the protective oxide is obtained by thermal process.

Protective layer 3 is then eliminated by a process in two steps consisting in transforming protective layer 3 into a fluorinated salt 5 and then eliminating fluorinated salt 5 by means of an anneal.

Figure 2:
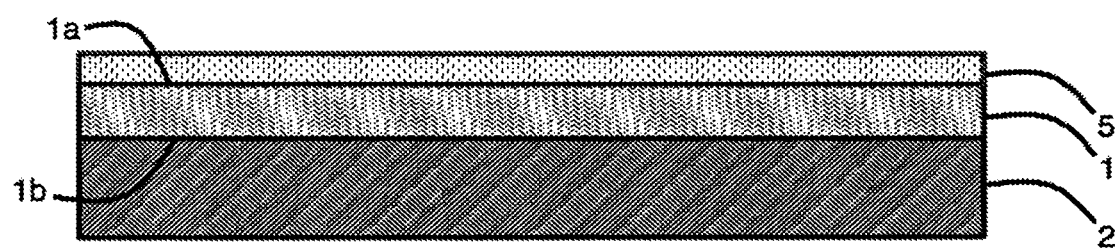
FIG. 2 represents a second step of a method for fabricating a monocrystalline structure, in schematic manner, in cross-section.

As illustrated in FIG. 2, the substrate whose surface is covered by the layer of protective oxide 3 is subjected to plasma treatment which is configured to transform the previously formed protective oxide layer 3 into a fluorinated salt 5.

The plasma treatment is a remote plasma treatment, i.e. the substrate is subjected to an atmosphere containing ions. The ions interact chemically with protective layer 3 to perform transformation of the latter and not for abrasion thereof.

Preferably, the time separating the end of the formation step of protective layer 3 and the beginning of the plasma treatment is less than 15 minutes. The beginning of the plasma treatment can be chosen as the time when the substrate is at a pressure lower than or equal to 5 Torr and possibly in an atmosphere containing a majority of argon.

In preferential manner, the plasma treatment is performed in an enclosure having an atmosphere containing at least $NH_3$ and $NF_3$ either simultaneously or consecutively. The atmosphere can also contain another gas enabling the previous two gases to be diluted, for example a gas chosen from $H_2$, He and Ar. Advantageously, the pressure in the enclosure is comprised between 2 and 10 Torr, preferably equal to 3 Torr.

A teaching relative to the transformation of protective oxide 3 into a fluorinated salt 5 is described in the document U.S. Pat. No. 8,501,629 or in the document US 2016/0192502. A protective oxide $SiO_2$ is converted into fluorinated salt $(NH_4F)_2SiF_6$ by means of the following chemical reaction: $NH_4F$ or $NH_4F.HF+SiO_2->(NH_4F)_2SiF_6$ (solid)+ $H_2O$ given in the publication "Advanced in situ pre-Ni silicide (Siconi) cleaning at 65 nm to resolve defects in NiSix modules", by R. Yang et al., *J. Vac. Sci. Technol. B Nanotechnol. Microelectron. Mater. Process. Meas. Phenom.*, vol. 28, no 1, p. 56-61, January 2010. Formation of the fluorinated salt is advantageously obtained using an atmosphere containing $NH_4F$ or $NH_4F.HF$.

Figure 3:
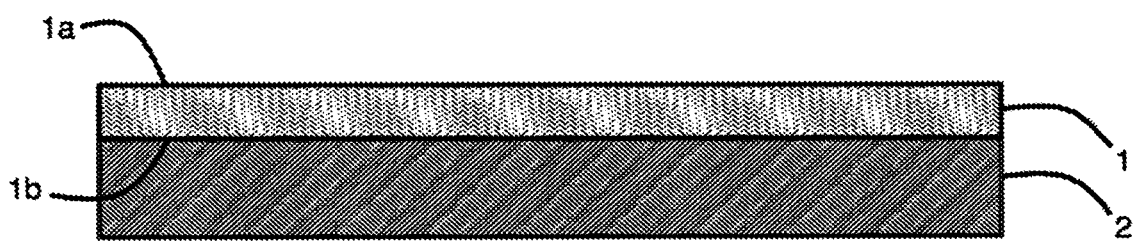
FIG. 3 represents a third step of a method for fabricating a monocrystalline structure, in schematic manner, in cross-section.

As illustrated in FIG. 3, following the plasma treatment, plasma-treated protective layer 3 undergoes annealing to eliminate fluorinated salt 5 for example by means of the following chemical reaction: $(NH_4F)_2SiF_6$ (solid)-> $SiF_4$ (gaseous)+$2NH_3$ (gaseous)+$2HF$ (gaseous), as presented in the publication "Advanced in situ pre-Ni silicide (Siconi) cleaning at 65 nm to resolve defects in NiSix modules", by R. Yang et al., *J. Vac. Sci. Technol. B Nanotechnol. Microelectron. Mater. Process. Meas. Phenom.*, vol. 28, no 1, p. 56-61, January 2010. To eliminate fluorinated salt 5, the temperature of the substrate is advantageously higher than 100° C. and lower than 500° C. and even more advantageously comprised between 100 and 200° C., preferentially equal to 180° C.

In advantageous manner, the substrate is devoid of any contact with an atmosphere containing oxygen between formation of salt 5 and elimination of salt 5. Preferably, after formation of salt 5, this substrate is in the presence of one or more atmospheres that only contain one or more of the gases chosen from $H_2$, $N_2$, He, Ar.

The use of protective layer 3 obtained by chemical process in association with the plasma treatment followed by elimination of salt 5 by annealing was tested on a layer of pure silicon, of pure germanium and of silicon and germanium alloy. It is apparent that the value of the surface roughness is substantially the same before and after treatment for the three materials tested. It was also observed that the surface is much poorer in contaminants than with a hydrofluoric acid bath only. It is then possible to deoxidise the surface before the epitaxy step without introducing a large quantity of contaminants. Results representative of the gain procured by formation of a chemical oxide followed by transformation of the latter into salt 5 and elimination thereof have been presented in the publications "Advanced in situ pre-Ni silicide (Siconi) cleaning at 65 nm to resolve defects in NiSix modules", by R. Yang et al., *J. Vac. Sci. Technol. B Nanotechnol. Microelectron. Mater. Process. Meas. Phenom.*, vol. 28, no 1, p. 56-61, January 2010 and "Wet and Siconi Cleaning sequences for SiGe p-type metal oxide semiconductor channels" by P. E. Raynal et al. Microelectron. Eng., vol. 187-188, p. 84-89, February 2018.

As this approach provides good results as far as the surface contamination is concerned, a target layer 4 was deposited in order to qualify the quality of the interface and above all the quality of target layer 4. It is apparent that target layer 4 presents a low surface roughness when it is deposited on a first layer 1 of pure silicon and of pure germanium.

On the other hand, it is apparent that the quality of the surface of target layer 4 deposited directly on first surface 1a made from silicon-germanium alloy is not satisfactory. The inventors observed the appearance of dots which seem to be created at the interface between target layer 4 and first layer 1. The deformation of the surface arising from the dots is reproduced in the thickness of target layer 4 so that target layer 4 presents on its surface a texturing in the form of randomly located dots. These dots are illustrated in FIGS. 6, 7 and 8 representative of three different protective layers.

In order to provide a target layer 4 having a better crystallographic quality, the following epitaxy method is proposed for deposition of a target layer 4 of better quality on a first layer 1a made from silicon-germanium alloy.

The substrate comprises first monocrystalline silicon-germanium alloy layer 1 with its first surface 1a uncovered. Fluorinated salt 5 was previously eliminated and the substrate has not been placed in the presence of oxygen since elimination of salt 5 was performed.

The substrate is inserted in the processing chamber in order to be placed in contact with an atmosphere containing at least one gaseous precursor of target layer 4. For example, the atmosphere contains a silicon precursor and germanium precursor to perform deposition of a monocrystalline silicon-germanium alloy target layer 4.

Target layer 4 is formed by chemical vapor deposition. When deposition of target layer 4 is performed, the pressure in the processing chamber is advantageously comprised between 1 Torr and 760 Torr, 760 Torr substantially representing atmospheric pressure. In advantageous manner, the pressure when deposition of target layer 4 is performed is comprised between 1 Torr and 100 Torr.

As formation of monocrystalline target layer 4 by epitaxy cannot be performed at ambient temperature under satisfactory industrial and/or quality conditions, it is advantageous to subject the substrate to the temperature ramp in order to be able to reach a temperature range more suitable for deposition of target layer 4. The temperature ramp can be a linear ramp, a ramp by steps or other forms.

The temperature range used enables target layer 4 to be deposited in lattice match with first monocrystalline layer 1 with deposition rates and/or crystallographic qualities compatible with an industrial use of the target layer. The temperature increase enables the growth rate of target layer 4 to be increased in comparison with what is accessible at the loading temperature.

The substrate is therefore placed in the processing chamber which is at a loading temperature. The processing chamber then applies a temperature ramp to increase the temperature of the substrate from the loading temperature up to an annealing temperature prior to deposition of target layer 4.

During the ramp, the substrate is advantageously kept in a pressure range comprised between 1 Torr and 760 Torr. The substrate is in an atmosphere that mainly contains at least one of the gases chosen from $H_2$, $N_2$, He and Ar. The atmosphere is devoid of oxygen. Preferably, the atmosphere contains $H_2$, $N_2$, Ar, He or a mixture of the latter, and does not contain a carbonaceous precursor or precursors of electric dopants of the alloy and/or of the target layer.

The substrate is placed on a susceptor that is at the loading temperature which will provide the substrate with heat. The loading temperature is adjusted according to the substrate so that the heat input does not damage the substrate. It is therefore advantageous to use a loading temperature comprised between 350° C. and 500° C. The loading temperature is chosen so as not to degrade first layer 1 of silicon-germanium alloy and especially first surface 1a. The loading temperature is lower than the degradation temperature of first surface 1a, i.e. lower than the formation temperature of the dots on first surface 1a or more generally of roughening of surface 1. The degradation temperature is the temperature above which first surface 1a becomes roughened. For example, it is defined in the field that a surface is roughened when, on an atomic force microscopy image of the surface, the roughness called "Root Mean Square" RMS is greater than or equal to 1 Å. It is also possible to define the roughness again by means of the atomic force microscopy image by a difference between a maximum height hmxax and a minimum height hmin of the roughness (hmax−hmin) greater than or equal to 10 Å.

Before target layer 4 is deposited, the substrate is kept for a few moments at an annealing temperature chosen so as to enable a reorganisation of the atoms forming the first surface of first layer 1 to improve the crystallographic quality of first surface 1a. The surface reorganisation anneal can be performed at a constant temperature or not.

The annealing temperature is at least equal to 500° C., preferably at least equal to 600° C. and even more preferentially at least equal to 620° C. The annealing time is preferably at least equal to 30 seconds. The lower the annealing temperature, the longer the annealing time has to be. A trade-off has to be found between annealing time and annealing temperature. During annealing, the atmosphere of the chamber does not contain any precursor of target layer 4 to avoid depositing a layer which would impede reorganisation of the atoms located at the surface forming the interface with the gaseous atmosphere which would freeze the state of the damaged surface.

It was observed that when the reorganisation anneal is performed, first surface 1a of the silicon-germanium alloy reorganises and forms dots. These dots are of small sizes and will grow with target layer 4. It is apparent that the annealing temperature applied to reorganise the surface prior to epitaxy is higher than the degradation temperature of first surface 1a. According to another interpretation, reorganisation of first surface 1a of silicon-germanium alloy results in the appearance of dots.

From the moment salt 5 is eliminated up to the time when substrate is placed in the processing chamber, the substrate is devoid of contact with an atmosphere containing oxygen to avoid forming an oxide at the surface. In advantageous manner, the substrate is only placed in contact with atmospheres exclusively containing $H_2$, $N_2$, Ar, He or a mixture of the latter. The gases used are preferentially ultra pure so as not to contaminate the surface on which epitaxy will be performed. Surface 1a is identical or almost identical to that obtained after elimination of salt 5.

It was observed that if, when the temperature ramp is performed, the atmosphere in the chamber does not contain any silicon precursor, the crystallographic quality of target layer 4 is unsatisfactory with the presence of dots at the surface as illustrated in FIGS. 6 to 8. On the contrary, the presence of a silicon precursor during the temperature ramp between the loading temperature and deposition temperature and more particularly below the degradation temperature prevents, reduces or delays the formation of dots before target layer 4 is deposited (cf. FIG. 11). It is possible to evaluate the degradation temperature for a given substrate by applying ramps at different maximum temperatures and evaluating the modification of the surface roughness by atomic force microscopy (AFM). The degradation temperature corresponds to the temperature at which dots appear for a given temperature ramp and a given substrate.

Figure 4:
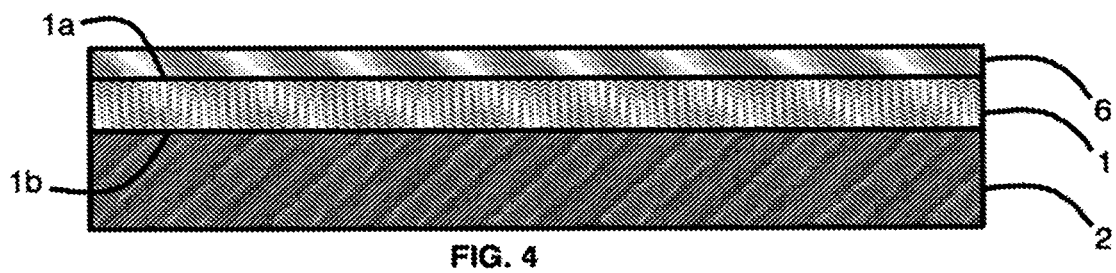
FIG. 4 represents a fourth step of a method for fabricating a monocrystalline structure, in schematic manner, in cross-section.

Insertion of at least one silicon precursor in the processing chamber enables the atoms of the alloy to be covered to prevent formation of dots. Insertion of the silicon precursor during the temperature ramp enables a buffer layer 6 to be formed separating first silicon-germanium alloy layer 1 and target layer 4 as illustrated in FIG. 4.

Figure 5:
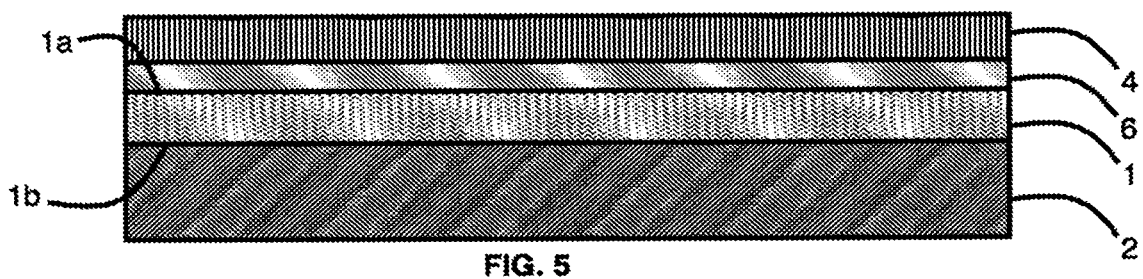
FIG. 5 represents a fifth step of a method for fabricating a monocrystalline structure, in schematic manner, in cross-section.

As illustrated in FIG. 5, buffer layer 6 is deposited before target layer 4. Buffer layer 6 separates target layer 4 and first layer 1.

Buffer layer 6 is formed from a material that better withstands the reorganisation anneal. Buffer layer 6 is advantageously formed from pure silicon, pure germanium or from silicon-germanium alloy with a germanium content of less than 15% or more than 98% in order to come close to the behaviour of pure silicon or of pure germanium. The germanium content is preferably less than 10% atomic or even more preferentially less than 5% atomic.

When buffer layer 6 is formed from a silicon-germanium alloy with a germanium content of less than 15% atomic, the germanium content of buffer layer 6 is preferentially lower than that of first target layer 1 by at least 5% in atomic percentage.

When buffer layer 6 is formed from a silicon-germanium alloy with a germanium content of more than 98% atomic, the germanium content of buffer layer 6 is preferentially higher than that of first target layer 1 by at least 5% in atomic percentage.

During the ramp, the silicon precursor is placed in the chamber at a temperature that is lower than the degradation temperature, preferably at least 50° C. lower, for example lower than 520° C., to cover the first surface before the atoms form dots. It is possible to add the silicon precursor below 520° C. and it is possible to keep the silicon precursor above 520° C.

The silicon precursor is inserted during the temperature ramp at a sufficiently low temperature to form a thin buffer layer 6. Buffer layer 6 is deposited with a low growth rate.

In advantageous manner, the precursor or precursors of buffer layer 6 are inserted during the temperature ramp so as to form a buffer layer with a thickness that is less than or equal to 2 nm, preferably less than or equal to 1 nm. Advantageously, at least three atomic planes are deposited to form buffer layer 6. The use of such a thickness range makes it possible to form a sufficiently thick buffer layer 6 to prevent the formation of dots while being sufficiently thin so as not to introduce crystallographic defects not able to be corrected when the reorganisation anneal is performed and so as not to disturb the crystallographic connection between target layer 4 and first layer 1.

Buffer layer 6 is deposited at a lower temperature than the degradation temperature, i.e. at low temperature and therefore with a low deposition rate. In order to keep a short deposition time, it is particularly advantageous to deposit the buffer layer when the temperature of the substrate is undergoing a change, i.e. a temperature increase.

In order to keep a method that is industrially viable, it is advantageous to have a temperature ramp of less than 5 minutes, even more preferentially less than 3 minutes and advantageously less than 2 minutes.

It is also advantageous to have a method that is usable over a large range of first silicon-germanium alloy layers 1. It is therefore advantageous to have a lower loading temperature than the range of degradation temperatures of the first layer which is typically between 500° C. and 600° C. The degradation temperature will be a lower the higher the germanium concentration and the thickness of the first layer (on a silicon substrate or a substrate terminated by a silicon layer).

In one particular case, deposition of buffer layer 6 is initiated at the loading temperature and continues up to the annealing temperature. In an alternative embodiment, deposition of buffer layer 6 is initiated at a higher temperature than the loading temperature and continues up to the annealing temperature. It is particularly advantageous to deposit the buffer layer up to the annealing temperature in order to take advantage of the highest temperatures and therefore the highest growth rates.

To avoid having a too thick buffer layer 6, it is possible to adjust the partial pressure of the precursors of buffer layer 6 to adjust the growth rate. It is also possible to choose a silicon precursor that has a high activation energy, for example dichlorosilane or trichlorosilane to have a strong dependence of the growth rate with the temperature and thus limit the thickness of buffer layer 6 at the beginning of the ramp and only deposit most of the buffer layer 6 just before the degradation temperature and up to the annealing temperature.

The temperature increase rate can be adjusted during the temperature ramp to define the thickness of the buffer layer. The temperature increase rate cannot be too high as it is necessary to maintain thermalization of the substrate. A too slow rate on the other hand penalises the advantage of the method.

The temperature ramp is used to thermalize the substrate, i.e. so that the temperature of the substrate equals the setpoint temperature of the chamber. It is therefore particularly advantageous for the rate of change of the temperature when the ramp is applied not to be too high which would result in a less good control of the growth rate. It is advantageous to have a rate of change of the temperature in the chamber comprised between 1° C./s and 5° C./s.

Deposition of the buffer layer can be stopped when the deposited thickness reaches the threshold thickness, for example 1 or 2 nm.

As the deposition temperature is low, the atoms do not all have sufficient energy to form a layer where the atoms are perfectly aligned. It is therefore particularly advantageous to choose deposition conditions for which the deposition rate is less than 5 nm/min.

In order to keep a short deposition method, it is advantageous to limit the duration of the ramp to 5 minutes, or in more general manner to limit the time separating insertion of the plate in the chamber and the beginning of deposition of target layer 4 to less than 5 minutes.

During the temperature increase, the substrate is subjected to an atmosphere that contains at least one silicon precursor. It is also possible to provide for the atmosphere to contain a chlorine precursor. In advantageous manner, the atmosphere contains dichlorosilane $SiH_2Cl_2$ which is a silicon precursor and a chlorine precursor. It is particularly advantageous to use a precursor that is at the same time a silicon precursor and a chlorine precursor. As the activation energy is high, the dependence of the growth rate with the temperature is high thereby enabling first surface 1a of the alloy to be saturated as from low temperatures while at the same time keeping a low growth rate.

As an alternative, the silicon precursor can be a hydride chosen for example from silane $SiH_4$, disilane $Si_2H_6$, trisilane $Si_3H_8$ and tetrasilane $Si_4H_{10}$.

The use of an atmosphere containing chlorine makes it possible to selectively deposit buffer layer 6 on first surface 1a and not to deposit buffer layer 6 on the dielectric material areas. In a particular embodiment, it is possible to provide a first silicon precursor formed by a hydride and a second chlorine precursor formed by gaseous HCl.

It is also possible to provide for the material of buffer layer 6 to be a silicon germanium alloy with a silicon precursor such as those presented in the foregoing and a germanium precursor advantageously chosen from germane $GeH_4$, digermane $Ge_2H_6$ and trigermane $Ge_3H_8$. It is further possible to provide for the addition of a chlorine precursor. It is also possible to use dichlorogermane.

The use of a silicon precursor in the form of a hydride makes it possible to deposit a buffer layer with a higher deposition rate than with dichlorosilane, the other operating parameters being preserved.

It is possible to choose a particular silicon precursor according to the maximum deposition temperature of buffer layer 6 so as to have a maximum deposition rate of buffer layer 6 that is low and advantageously comprised between 0.5 and 5 nm/min.

For example, if the maximum deposition temperature of buffer layer 6 is higher than 600° C., the atmosphere contains exclusively or almost exclusively dichlororilane or trichlorosilane as silicon precursor.

If the maximum deposition temperature of buffer layer 6 is lower than 600° C. and higher than 500° C., the atmosphere contains as silicon precursor exclusively or almost exclusively silane preferably without a chlorine precursor or possibly dichlorosilane.

If the maximum deposition temperature of buffer layer 6 is lower than 500° C. and higher than 400° C., the atmosphere contains as silicon precursor exclusively or almost exclusively disilane preferably without a chlorine precursor.

If the maximum deposition temperature of buffer layer 6 is lower than 400° C., the atmosphere contains exclusively or almost exclusively trisilane and/or tetrasilane as silicon precursor.

It was observed that providing such an atmosphere in the temperature increase phase enables first surface 1a to be covered with a thin monocrystalline silicon layer lattice matched with first monocrystalline layer 1. The thin layer of silicon encapsulates first layer 1 made of silicon-germanium alloy thereby enabling first layer 1 to be made less sensitive to the thermal budget as far as an increase of its roughness in the form of dots is concerned. The same is the case for a pure germanium layer or for a silicon-germanium alloy cited in the foregoing which has a behaviour close to that of pure silicon or of pure germanium with however more stringent operating conditions.

It was for example observed that for a first monocrystalline layer 1 of silicon-germanium alloy with a germanium content equal to 40% atomic and a thickness equal to 15 nanometers, application of a temperature ramp up to 650° C. results in the appearance of dots at the surface of first layer 1. The dots are representative of a reconstruction of the surface. As the surface of first layer 1 is very rough, the second layer deposited on first layer 1 will naturally be of poor quality, for example incompatible with formation of a channel of a field effect transistor.

For example purposes, with an atmosphere constituted of dichlorosilane and hydrogen $H_2$ in an enclosure having a temperature equal to 650° C. and for a pressure equal to 20 Torr, it is possible to achieve a deposition rate substantially equal to 5 Å/min. As the deposition rate changes exponentially with the temperature, this results in the deposition rate quickly becoming extremely low when the temperature decreases, the other parameters being constant. Therefore, during the temperature ramp from about 500° C. up to 650° C., it is possible to form a buffer layer 6 with a thickness of less than 2 nm which prevents the appearance of dots without lengthening the duration of the temperature ramp.

In one embodiment, the deposition temperature of target layer 4 is equal to the annealing temperature. In another configuration, the deposition temperature of target layer 4 is lower than the annealing temperature. What is meant by annealing temperature is advantageously the minimum temperature between stopping of the precursor or precursors forming the buffer layer and injection of the precursor or precursors forming target layer 4. It is also possible to consider that the annealing temperature is the minimum or mean temperature between the end of deposition of the buffer layer and the beginning of deposition of the target layer. In an alternative embodiment, at least one silicon precursor is also injected into the processing chamber when annealing is performed.

In advantageous manner, the mean deposition rate of buffer layer 6 is lower than the mean deposition rate of target layer 4. This configuration enables a thin mono-crystalline layer to be formed with possible crystallographic defects that are able to be corrected.

When deposition of buffer layer 6 takes place, the atmosphere contains a vector gas which is advantageously hydrogen. It is also possible to use nitrogen. When deposition of target layer 4 takes place, the atmosphere contains a vector gas which is advantageously hydrogen. It is also possible to use nitrogen. It is particularly advantageous to use the same vector gas to form buffer layer 6 and target layer 4. The vector gas is a gas devoid of silicon, germanium, oxygen and electrical dopants of silicon such as boron, arsenic and phosphorus. In general manner, the vector gas is a gas which does not enable a material to be deposited at the surface of first layer 1 and which is devoid of electrical dopants. Preferentially, a single vector gas is used from loading of the substrate up to the completion of deposition of target layer 4. The vector gas is advantageously hydrogen.

It is particularly advantageous to maintain a reorganisation annealing step preferably in hydrogen and devoid of oxygen and of precursors of target layer 4 in order to reorganise the surface. It was observed that in the absence of this reorganisation anneal, the quality of target layer 4 is less good. For example, a continuous deposition of silicon starting from the loading temperature does not enable a good quality crystallographic layer to be formed.

In a particular embodiment, the loading temperature is lower than the degradation temperature by at least 50° C., preferably by at least 75° C. and even more preferably by at least 100° C.

As first layer 1 is made from silicon-germanium alloy, the annealing temperature and more generally the thermal budget of the anneal are configured to prevent deterioration of first layer 1. The thermal budget is configured to prevent dewetting of first layer 1 when the latter is on an oxide or nitride film such as a silicon oxide or a silicon nitride. The thermal budget is configured to prevent relaxing of the stresses in first layer 1 which results in generation of dislocations. Dewetting and generation of dislocations are assumed to take place later than formation of the dots.

It is therefore advantageous to choose a loading temperature that is lower than the degradation temperature by at least 50° C., preferably by at least 75° C. and even more preferably by at least 100° C.

Pursuing the same logic, to achieve a method that is suitable for a large diversity of first layers 1, the injection temperature of the silicon precursor in the chamber is lower than the degradation temperature by at least 50° C., preferably by at least 75° C. and even more preferably by at least 100° C.

As the threshold degradation temperature depends on the substrate and in particular on the thickness of first silicon-germanium alloy layer 1, the composition of the alloy and the nature of the support, it is preferable to have a temperature ramp over at least 50° C. to obtain an efficient buffer layer for a wide variety of substrates.

In an advantageous embodiment, the temperature ramp, reorganisation anneal and deposition of target layer 4 are performed with a vector gas flow rate at least equal to 1 sLm (i.e. 1 standard litre per minute). The vector gas flow rate is advantageously comprised between 1 sLm and 50 sLm, preferably equal to 30 sLm. The vector gas is preferentially hydrogen.

It is also advantageous to have a silicon precursor flow rate comprised between 10 sccm (10 standard cubic centimeters per minute) and 1000 sccm. It is advantageous to use a dichlorosilane flow rate equal or substantially equal to 360 sccm. An identical flow rate can be used for silane. It is advantageous to use a flow rate equal to 180 sccm for disilane $Si_2H_6$ or a flow rate equal to 120 sccm for trisilane $Si_3H_8$. It is further possible to use a flow rate equal to 90 sccm for tetrasilane $Si_4H_{10}$.

The above-mentioned method is more particularly advantageous when silicon-germanium alloy first layer 1 comprises a first surface having a germanium content comprised between 20% and 95% atomic as it is apparent that in this range the behaviour of the silicon-germanium alloy differs notably from the behaviour of a pure silicon and of a pure germanium. Even more preferentially, the first surface presents a germanium content comprised between 25% and 90% atomic and even more preferentially between 30% and 90% atomic.

If the buffer layer is deposited in selective manner, the method for depositing the buffer layer does not comprise an alternation of a first deposition phase with hydride chemistry followed by a second etching phase with chlorinated chemistry. The purpose of the first phase is to deposit a first thickness of material and the purpose of the second phase is to etch a part of the deposited thickness and especially to etch the possible clusters of materials which were deposited on the electrically insulating material areas.

In advantageous manner, the minimum deposition temperature of target layer 4 is higher than the degradation temperature of protective oxide 3 and higher than a surface reorganisation temperature of the first monocrystalline silicon-germanium alloy layer 1. For example, target layer 4 is deposited at a temperature of more than 650° C., even more than 700° C. and possibly more than 800° C. In advantageous manner, the maximum deposition temperature is less than 1000° C., preferably less than 900° C.

According to the embodiments, the thickness of target layer 4 can vary between a few tens of nanometers and several microns.

First monocrystalline silicon-germanium alloy layer 1 can have a thickness of less than 50 nm, and preferentially less than 20 nm and even more preferentially less than 10 nm to advantageously define a conduction channel of a field effect transistor. The target layer then advantageously has a thickness of less than 100 nm.

As an alternative, first monocrystalline silicon-germanium alloy layer 1 can have a thickness of more than 1 micron to define a waveguide made of silicon-germanium alloy. It is then advantageous to cover the SiGe layer with a target layer having a thickness of more than one micron.

The gaseous atmosphere can be devoid of electrical dopant precursors or on the contrary it can contain at least one electrical dopant. Pursuing the same logic, the gaseous atmosphere can be devoid of or contain a carbon precursor to form target layer 4.

When deposition of target layer 4 is performed, the temperature in the chamber can be constant or it can vary in the form of one or more temperature ramps.

In advantageous manner, deposition of target layer 4 is performed with a growth rate at least equal to 0.5 nm/min, advantageously several nm/min for example more than 5 nm/min, or even several tens of nm/min depending on the thickness of target layer 4 to be epitaxied, for example comprised between 20 nm/min and 500 nm/min.

FIGS. 6, 7 and 8 represent images of the surface of a silicon-germanium alloy target layer 4 with a germanium content equal to 40% atomic. The surface roughness was measured with an atomic force microscope on 10*10 μm² surfaces. Target layer 4 was deposited directly on first surface 1a of a first layer of silicon-germanium alloy with a germanium content equal to 40%. FIGS. 6, 7 and 8 differ only by the cleanings and treatments performed before insertion in the processing chamber used for deposition of target layer 4.

FIG. 6 corresponds to cleaning in a hydrofluoric acid bath followed by formation of a protective oxide 3 with an oxidising bath of SC1 type and then by transformation of protective oxide 3 into a fluorinated salt 5 and elimination of fluorinated salt 5. Target layer 4 was deposited without buffer layer 6.

The method used for FIG. 7 differs from that of FIG. 6 by the use of an oxidising bath of SC1 type at higher temperature. The method used for FIG. 8 differs from that of FIG. 6 by the use of an oxidising bath containing ozone.

It is apparent from these three images that the absence of buffer layer 6 results in the formation of a granular surface.

FIGS. 9 and 10 represent images of the surface of a silicon-germanium alloy target layer with a germanium content equal to 40% atomic. The surface roughness was measured with an atomic force microscope on 10*10 µm² surfaces. The target layer was deposited directly on first surface 1a of a first layer of silicon-germanium alloy with a germanium content equal to 40% atomic under the same conditions as for FIGS. 6, 7 and 8. FIG. 9 correspond to simple deoxidation of the surface with a hydrofluoric acid bath which corresponds substantially to the teaching of the document U.S. Pat. No. 7,462,239. FIG. 10 corresponds to deoxidation of the surface by transformation of the oxide present at the surface of the first layer of salt and elimination of the salt.

For these two figures, a double corrugated sheet structure commonly referred to as "cross hatch" is observed representative of a plastic relaxation of the accumulated stresses.

FIG. 11 represents an image of the surface of a silicon-germanium alloy target layer with a germanium content equal to 40% atomic. The surface roughness was measured with an atomic force microscope on 10*10 µm² surfaces. The method used corresponds to that described in the foregoing with use of a pure silicon buffer layer with dichlorosilane and a hydrogen anneal at a temperature of 650° C.

Figure 12:
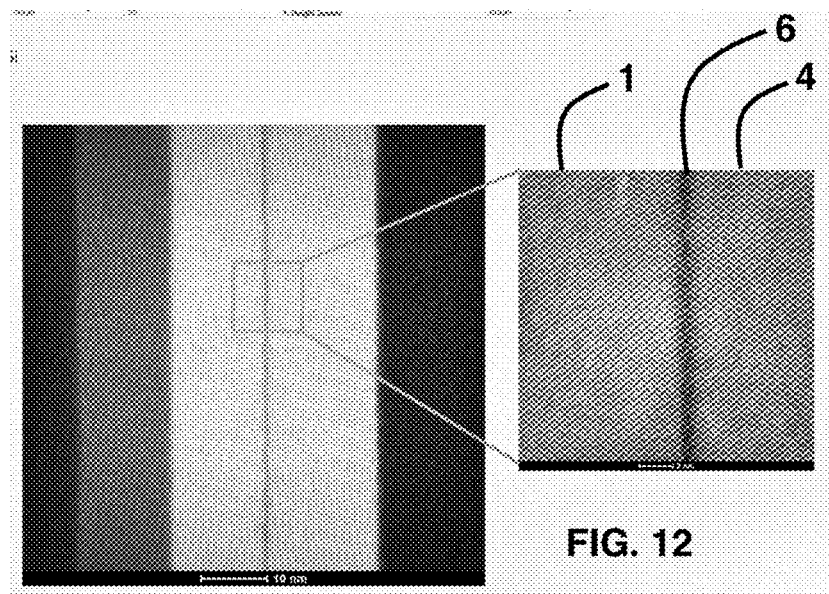
FIG. 12 represents a snapshot obtained by transmission electron microscopy of a stack obtained according to a method according to the invention.
Figure 13:
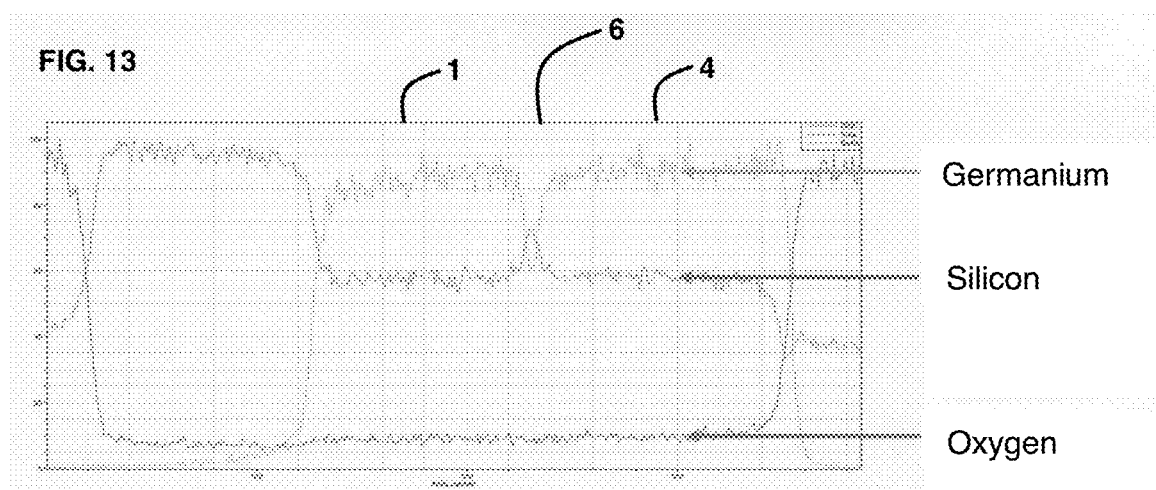
FIG. 13 represents an EDX profile of a stack obtained according to a method according to the invention.

FIG. 12 represents a snapshot obtained by transmission electron microscopy of a stack in accordance with that of FIG. 11. FIG. 13 represents an EDX profile of the Oxygen, Silicon and Germanium elements of the stack illustrated in FIG. 12. The oxygen peak present on the left part of the profile represents a buried oxide layer of a SOI substrate.

In an advantageous embodiment, first layer 1a forms or extends from a conduction channel of a field effect transistor, for example of MOS type. The transistor can be of planar configuration or of FinFET configuration. However, the problem of epitaxy resumption at low temperature from a silicon-germanium alloy surface can be present in other fields, such as for example that of SiGe waveguides in the mid-infrared which are to be encapsulated by a silicon layer.

The invention claimed is:

1. Method for growing a monocrystalline target layer by epitaxy successively comprising:
providing a substrate comprising a first monocrystalline layer made of silicon-germanium alloy, the first monocrystalline layer having a first surface covered by a protective oxide obtained by wet process oxidation of the first surface or obtained by thermal process, the first surface of the first monocrystalline layer having a degradation temperature at which the first surface roughens and forms dots,
subjecting the protective oxide to plasma treatment to form a fluorinated salt and then eliminating the fluorinated salt by means of an anneal,
inserting the substrate in a processing chamber at a loading temperature lower than the degradation temperature,
subjecting the substrate to a temperature ramp from the loading temperature to an annealing temperature higher than the degradation temperature, wherein during the temperature ramp, at least one silicon precursor is inserted in the processing chamber between the loading temperature and the degradation temperature so as to deposit a monocrystalline buffer layer lattice matched with the first layer,
annealing the first surface at a temperature higher than or equal to the annealing temperature in a hydrogen or nitrogen atmosphere, and
depositing the monocrystalline target layer on the first surface by chemical vapor deposition, the monocrystalline target layer being lattice-matched with the first monocrystalline layer, the monocrystalline buffer layer separating the monocrystalline target layer and the first layer.

2. Method for growing according to claim 1 wherein during the temperature ramp, the atmosphere in the processing chamber is devoid of any germanium precursor.

3. Method for growing according to claim 1 wherein the processing chamber is devoid of a precursor of materials forming the monocrystalline target layer, of silicon and of germanium precursors during the anneal.

4. Method for growing according to claim 1 wherein the thickness of the monocrystalline buffer layer is less than or equal to 2 nm.

5. Method for growing according to claim 1 wherein the maximum growth rate of the monocrystalline buffer layer is less than 2 nm/min.

6. Method for growing according to claim 1 wherein the loading temperature is lower than 500° C.

7. Method for growing according to claim 1 wherein during the temperature ramp, at least one germanium precursor is inserted in the processing chamber between the loading temperature and the degradation temperature so as to deposit the monocrystalline buffer layer, and wherein the monocrystalline buffer layer has a continually decreasing germanium content from the interface with the monocrystalline first layer to the monocrystalline target layer.

8. Method for growing according to claim 1 wherein the monocrystalline target layer is chosen from a silicon-germanium alloy, a pure germanium film, or a material of III-V type.

9. Method for growing according to claim 1 wherein the first surface has an atomic percentage germanium content comprised between 20% and 95%.

10. Method for growing according to claim 9 wherein during the temperature ramp, at least one germanium precursor is inserted in the processing chamber between the loading temperature and the degradation temperature so as to deposit the monocrystalline buffer layer, and wherein the monocrystalline buffer layer is made from silicon-germanium alloy with a germanium content of less than 15% atomic and lower than the first germanium content by at least 5% in atomic percent.

11. Method for growing according to claim 1 wherein:
the degradation temperature is greater than or equal to 550° C., and the silicon precursor contains dichlorosilane, or
the degradation temperature is between 500° C. and 600° C., and the silicon precursor contains silane, or
the degradation temperature is between 450° C. and 550° C., and the silicon precursor contains disilane, or
the degradation temperature is lower than 500° C., and the silicon precursor contains trisilane and/or tetrasilane.

12. Method for growing according to claim 1 wherein the at least one silicon precursor is also inserted in the processing chamber during the annealing at the temperature higher than or equal to the annealing temperature.

13. Method for growing a monocrystalline target layer by epitaxy successively comprising:

providing a substrate comprising a first monocrystalline layer made of silicon-germanium alloy, the first monocrystalline layer having a first surface covered by a protective oxide obtained by wet process oxidation of the first surface or obtained by thermal process, the first surface of the first monocrystalline layer having a degradation temperature at which the first surface roughens and forms dots, subjecting the protective oxide to plasma treatment to form a fluorinated salt and then eliminating the fluorinated salt by means of an anneal, inserting the substrate in a processing chamber at a loading temperature lower than the degradation temperature, subjecting the substrate to a temperature ramp from the loading temperature to an annealing temperature higher than the degradation temperature, wherein during the temperature ramp, a germanium precursor is inserted in the processing chamber between the loading temperature and the degradation temperature so as to deposit a monocrystalline buffer layer lattice matched with the first layer, the monocrystalline buffer layer being made from pure germanium annealing the first surface at a temperature higher than or equal to the annealing temperature in a hydrogen or nitrogen atmosphere, and depositing the monocrystalline target layer on the first surface by chemical vapor deposition, the monocrystalline target layer being lattice matched with the first monocrystalline layer, the monocrystalline buffer layer separating the monocrystalline target layer and the first layer.

* * * * *